(12) United States Patent
Lee et al.

(10) Patent No.: US 9,819,523 B2
(45) Date of Patent: Nov. 14, 2017

(54) INTELLIGENT EQUALIZATION FOR A THREE-TRANSMITTER MULTI-PHASE SYSTEM

(71) Applicant: QUALCOMM Incorporated, San Diego, CA (US)

(72) Inventors: Chulkyu Lee, San Diego, CA (US); Shih-Wei Chou, San Diego, CA (US); George Wiley, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/453,352

(22) Filed: Mar. 8, 2017

(65) Prior Publication Data

US 2017/0264471 A1 Sep. 14, 2017

Related U.S. Application Data (60) Provisional application No. 62/306,024, filed on Mar. 9, 2016.

(51) Int. Cl.
| | |
|---|---|
| *H04K 1/02* | (2006.01) |
| *H04L 25/03* | (2006.01) |
| *H04L 25/49* | (2006.01) |
| *H04B 7/06* | (2006.01) |

(52) U.S. Cl.
CPC ....... *H04L 25/4917* (2013.01); *H04B 7/0682* (2013.01); *H04L 25/03343* (2013.01)

(58) Field of Classification Search
CPC . H04L 25/4908; H04L 25/4904; H04L 25/14; H04L 25/4925; H04L 27/368; H04L 25/03343; H03M 5/12; H03F 1/3247; H03F 1/3294; H03F 2201/3233

USPC ............... 375/259–264, 284–288, 290–296; 341/50, 58, 68–70
See application file for complete search history.

(56) References Cited

U.S. PATENT DOCUMENTS

| | | | | |
|---|---|---|---|---|
| 3,693,113 | A * | 9/1972 | Glasser | H03K 5/04 327/172 |
| 7,135,884 | B1 * | 11/2006 | Talbot | H03K 17/164 326/30 |
| 7,697,628 | B2 * | 4/2010 | Choi | H04L 25/085 341/55 |
| 7,983,347 | B2 * | 7/2011 | Hamada | H04L 25/0272 375/244 |
| 8,004,330 | B1 * | 8/2011 | Acimovic | H03K 19/00361 327/108 |
| 8,044,734 | B2 * | 10/2011 | Lane | H04B 1/0475 331/135 |
| 8,064,535 | B2 * | 11/2011 | Wiley | H04L 5/20 341/58 |

(Continued)

FOREIGN PATENT DOCUMENTS

WO WO-2015179546 A1 11/2015

OTHER PUBLICATIONS

International Search Report and Written Opinion—PCT/US2017/021531—ISA/EPO—May 18, 2017.

*Primary Examiner* — James M Perez
(74) *Attorney, Agent, or Firm* — Haynes and Boone, LLP (57) ABSTRACT

An intelligent equalization technique is provided for a three-transmitter system in which mid-level transitions are selectively emphasized and de-emphasized to conserve power and reduce data jitter.

25 Claims, 9 Drawing Sheets

(56) References Cited

U.S. PATENT DOCUMENTS

| | | | |
|---|---|---|---|
| 8,102,696 B2* | 1/2012 | Katoh | G11C 13/00 365/148 |
| 8,198,912 B1* | 6/2012 | Thinakaran | H03K 19/01707 326/30 |
| 8,358,156 B1* | 1/2013 | Abugharbieh | H03K 19/01755 327/108 |
| 8,446,173 B1* | 5/2013 | Faucher | H03K 19/00361 326/27 |
| 8,472,551 B2* | 6/2013 | Wiley | H04L 5/20 341/58 |
| 8,611,340 B2* | 12/2013 | McCloud | H04L 25/0202 370/252 |
| 8,761,387 B2* | 6/2014 | Chang | H04B 3/32 370/201 |
| 9,083,598 B2* | 7/2015 | Wiley | H04L 5/20 |
| 9,455,850 B2* | 9/2016 | Wiley | H04L 5/20 |
| 9,520,988 B1* | 12/2016 | Wiley | H04L 7/0083 |
| 9,525,402 B1* | 12/2016 | Chien | H03K 3/013 |
| 9,544,864 B1* | 1/2017 | Takahashi | H04W 56/0015 |
| 9,553,635 B1* | 1/2017 | Sejpal | H04B 3/54 |
| 9,621,333 B2* | 4/2017 | Wiley | H04L 7/0087 |
| 9,654,181 B1* | 5/2017 | Wobak | H04B 5/0031 |
| 9,680,666 B2* | 6/2017 | Wiley | H04L 25/0272 |
| 2005/0254659 A1* | 11/2005 | Heinsen | H04S 1/007 381/13 |
| 2006/0002482 A1* | 1/2006 | Walker | G06F 13/4072 375/257 |
| 2006/0006901 A1* | 1/2006 | Groen | H04L 25/0282 326/27 |
| 2007/0124518 A1* | 5/2007 | Fujiwara | G06F 13/4086 710/71 |
| 2008/0069267 A1* | 3/2008 | Marlett | H04L 25/03878 375/296 |
| 2008/0195792 A1* | 8/2008 | Teil | G06F 13/4072 710/313 |
| 2009/0002017 A1* | 1/2009 | Bhattacharya | H03K 19/00376 326/21 |
| 2009/0231913 A1* | 9/2009 | Tonomura | G11C 7/04 365/163 |
| 2010/0026395 A1* | 2/2010 | Lane | H04B 1/0475 331/15 |
| 2010/0195518 A1* | 8/2010 | McCloud | H04L 25/0202 370/252 |
| 2010/0254713 A1* | 10/2010 | Tanaka | H01S 5/042 398/182 |
| 2010/0272138 A1* | 10/2010 | Chiba | G11B 7/1263 372/30 |
| 2011/0069627 A1* | 3/2011 | Sridhara | G01S 11/06 370/252 |
| 2011/0080237 A1* | 4/2011 | Fratti | H04L 25/0288 333/28 R |
| 2011/0268454 A1* | 11/2011 | Fujita | H01S 5/0428 398/135 |
| 2012/0044008 A1* | 2/2012 | Chern | H03K 19/01852 327/333 |
| 2013/0057321 A1* | 3/2013 | Rao | H04L 25/0274 327/108 |
| 2013/0182190 A1* | 7/2013 | McCartney | H04B 3/54 348/730 |
| 2013/0241620 A1* | 9/2013 | Suzuki | H03K 5/01 327/306 |
| 2014/0185374 A1* | 7/2014 | Ramachandra | G11C 16/06 365/185.2 |
| 2014/0269881 A1* | 9/2014 | He | H04L 25/03878 375/231 |
| 2015/0030112 A1* | 1/2015 | Wiley | H04L 25/0292 375/360 |
| 2015/0319014 A1* | 11/2015 | Chien | H04L 25/085 375/296 |
| 2016/0013926 A1* | 1/2016 | Kil | H04L 7/0091 370/517 |
| 2016/0087633 A1* | 3/2016 | Zhang | H03K 19/0944 327/109 |
| 2016/0119169 A1* | 4/2016 | Schober | H04L 27/0014 370/503 |
| 2016/0204964 A1* | 7/2016 | Takahashi | H04L 25/028 375/230 |
| 2016/0374091 A1* | 12/2016 | Saeki | H04L 25/0288 |
| 2017/0026083 A1* | 1/2017 | Sejpal | H04B 3/54 |
| 2017/0026204 A1* | 1/2017 | Takahashi | H04L 25/028 |
| 2017/0039163 A1* | 2/2017 | Sejpal | H04L 25/4917 |
| 2017/0264471 A1* | 9/2017 | Lee | H04L 25/4917 |

* cited by examiner

INTELLIGENT EQUALIZATION FOR A THREE-TRANSMITTER MULTI-PHASE SYSTEM

CROSS-REFERENCE TO RELATED APPLICATIONS

This application claims the benefit of U.S. Provisional Application No. 62/306,024, filed Mar. 9, 2016, the contents of which are incorporated herein in their entirety.

TECHNICAL FIELD

This application relates to a three-transmitter multi-phase system, and more particularly to a three-phase transmitter multi-phase system with mid-level adaptive equalization.

BACKGROUND

Transmission of multi-bit words typically occurs over multi-wire buses. For example, an eight-bit word may be transmitted over a bus having eight wires, one wire for each bit. But in such conventional busses, each bit carried on a given wire is independent of the remaining bits. As the data rates increase, the resulting signaling becomes problematic in that the various bits in a word become skewed from each other as the word propagates over the bus.

Given the issues with skew between multiple bits in high-speed communication, various serializer/deserializer (SERDES) systems have been developed. A SERDES transmitter serializes a multi-bit word into a series of corresponding bits for transmission to a receiver. There can then be no such skew between adjacent bits on a multi-wire bus since a single transmission line (which may be differential) is used in a SERDES system. The SERDES receiver deserializes the received serial bit stream into the original word. However, the SERDES transmission line and the receiver load introduce distortion as the data transmission rate exceeds, for example, 10 GHz. Adjacent bits in the serial bit stream then begin to interfere with each other. Complicated equalizing schemes become necessary to fight the resulting inter-symbol interference and thus it becomes difficult to push SERDES data transmission rates ever higher.

To increase data transmission rates over the SERDES limitations, a three-phase signaling protocol has been developed in which three transmitters drive three separate transmission lines. In a voltage-mode embodiment, one transmitter drives it output signal to a high voltage, another transmitter drives its output signal to a mid-level voltage, and a remaining transmitter drives its output signal to a low voltage. The high voltage transmitter and low voltage transmitter may be deemed to form an active pair. From a set of three transmitters, there are three distinct pairs of transmitters that can be active. Within each pair, there are two possibilities depending upon which transmitter is high versus which transmitter is low. There are thus six distinct combinations of output signals in a three-transmitter multi-phase system. Each distinct combination of output signals may be denoted as a multi-phase symbol. Since there are six possible symbols, each transmitted symbol represents 2.5 bits. In this fashion, data transmission speeds may be more than doubled over binary transmission at the same symbol rate using a single channel, albeit at the cost of increased power consumption.

In the receiver for a multi-phase communication system, a frontend circuit decodes the received transmitter output signals to produce the corresponding binary symbol. The six different symbols may be represented by six binary words: [100], [010], [001], [110], [101], and [011]. The bits in these symbols may be represented by the binary variables A, B, and C. For example, the symbol [100] corresponds to A=1, B=0, and C=0. To ensure that one of the three binary variables changes state for every transmitted symbol, no self-transition is allowed. For example, suppose the symbol [001] had just been received. The subsequent symbol cannot be [001] as this would violate the ban against self-transition. In this fashion, a clock can be extracted from every received symbol from the guaranteed binary transition of at least one of the binary signals.

Although a three-transmitter multi-phase system will have less inter-symbol interference (ISI) than a SERDES system operating at the same data rate, inter-symbol interference must still be addressed for a three-transmitter multi-phase system as the data rate is increased ever higher. But conventional equalization techniques are adapted from traditional two-level (high voltage for a binary one and low voltage for a binary zero) signaling. Application of such traditional equalization techniques to a three-transmitter multi-phase system results in over-emphasis that worsens timing jitter and wastes power.

Accordingly, there is a need in the art for a three-transmitter multi-phase system with improved equalization techniques.

SUMMARY

A three-transmitter multi-phase system is provided with intelligent equalization that selectively emphasizes and de-emphasizes rising and falling edges for the mid-level transitions of transmitter output signals (transitions to or from the mid-level output voltage). A logic circuit controls the emphasis and de-emphasis depending upon the transition from a previous multi-phase symbol to a current multi-phase symbol. Each transmitter output signal transitions uniquely into a high voltage, mid-level voltage or a low voltage for each multi-phase symbol. The resulting selective emphasis and de-emphasis of just the mid-level transitions advantageously reduces power consumption compared to an application of traditional equalization while reducing data jitter.

These and other advantageous features may be better appreciated through the following detailed description.

DETAILED DESCRIPTION

To reduce timing jitter and power consumption, a three-transmitter multi-phase system is provided with an intelligent equalization technique. The equalization technique is denoted as "intelligent" as it is adaptive to the various transitions that are possible for each transmitter output signal. Some transitions (rising edges or falling edges) are emphasized whereas other types of transitions are actually de-emphasized. Moreover, some transitions are neither emphasized nor de-emphasized. The selective emphasis, de-emphasis, and the lack thereof may be better appreciated with regard to an example three-transmitter multi-phase system 100 shown in FIG. 1. An encoder 135 encodes an input data stream into consecutive multi-phase symbols. Each multi-phase symbol has three components, corresponding to the states for the output signals for a first transmitter 105, a second transmitter 110, and a third transmitter 115. Each transmitter drives a corresponding transmission line. First transmitter 105 drivers a first transmission line 120 with a transmitter output signal A whereas second transmitter 110 drives a second transmission line 125 with a transmitter output signal B. Similarly, third transmitter 115 drives a third transmission line 130 with a transmitter output signal C.

Figure 1:
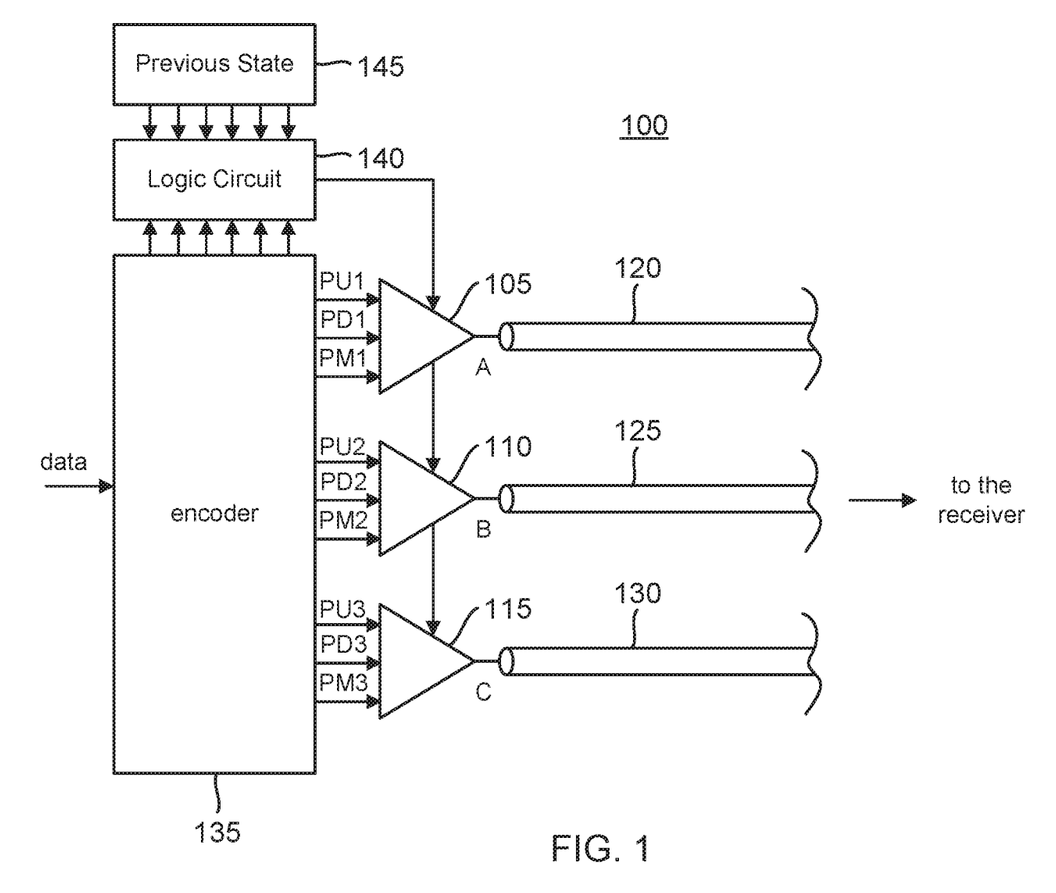
FIG. 1 is a block diagram of an example three-transmitter multi-phase system configured for intelligent equalization in accordance with an aspect of the disclosure.

The transmitters in system 100 can either be voltage-mode drivers or current-mode drivers with regard to driving their corresponding transmission lines. In that regard, each output signal A, B, and C may be deemed to include a plurality of levels such as a high level, a mid-level and a low level. In a voltage-mode embodiment, these level are all voltage levels. Conversely, in a current-mode embodiment, the signal levels are all current levels. The selective emphasis and de-emphasis of rising and falling edges for the transmitter output signals disclosed herein involves the use of additional signal levels. For example, the falling edge transition of an output signal from the mid-level to the low level may be emphasized by transitioning the output signal to a reduced low level that is less than the low level during an initial portion of a current multi-phase symbol. This output signal may then be returned to the low level for a remainder of the multi-phase symbol. Similarly, the falling edge transition of an output signal from the mid-level to the low level may be selectively de-emphasized by first transitioning the output signal to an increased low level during the initial portion of the current multi-phase symbol. The increased low level is greater than the low level but less than the reduced mid-level. By selectively emphasizing and de-emphasizing rising and falling edge in the transmitter output signals, jitter is advantageously reduced as compared to conventional three-transmitter operation.

The following discussion will be directed to a voltage-mode driver implementation but it will be appreciated that the intelligent equalization disclosed herein may be readily applied to a current-mode driver implementation. Depending upon the data stream, encoder 135 commands each transmitter to drive its transmission line with either a high voltage, a low voltage, or an intermediate voltage. In the following discussion, the high voltage is referred to as VOH, the low voltage as VOL, and the intermediate (mid-level) voltage as VM. As implied by the names, VOH is higher than VOL. VM can equal (VOH−VOL)/2 or some other intermediate voltage that is less than VOH but greater than VOL. In the absence of any intelligent equalization, each multi-phase symbol for system 100 involves the driving of one of the transmission lines with VOH, another with VM, and a remaining one with VOL. In particular, encoder 135 can command a particular transmitter to pull up (PU) its output voltage towards VOH or pull down (PD) its output voltage towards VOL, Similarly, encoder 135 can command a particular transmitter to mid-range (PM) its output voltage to VM.

There are thus three possible commands from encoder 135 to each transmitter. The PU, PD, and PM commands to first transmitter 105 are denoted as PU1, PD1, and PM1. Only one of these commands may be asserted for any given symbol transmission. Similarly, encoder 135 can assert one of a PU2, PD2, and PM2 command to second transmitter 110 and can assert one of a PU3, PD3, and PM3 command to third transmitter 115. It will be appreciated that in alternative embodiments, the PM commands may be omitted in that an assertion of the PM command to a particular transmitter may be indicated by de-asserting both the corresponding PU command and the corresponding PD command.

Figure 2A:
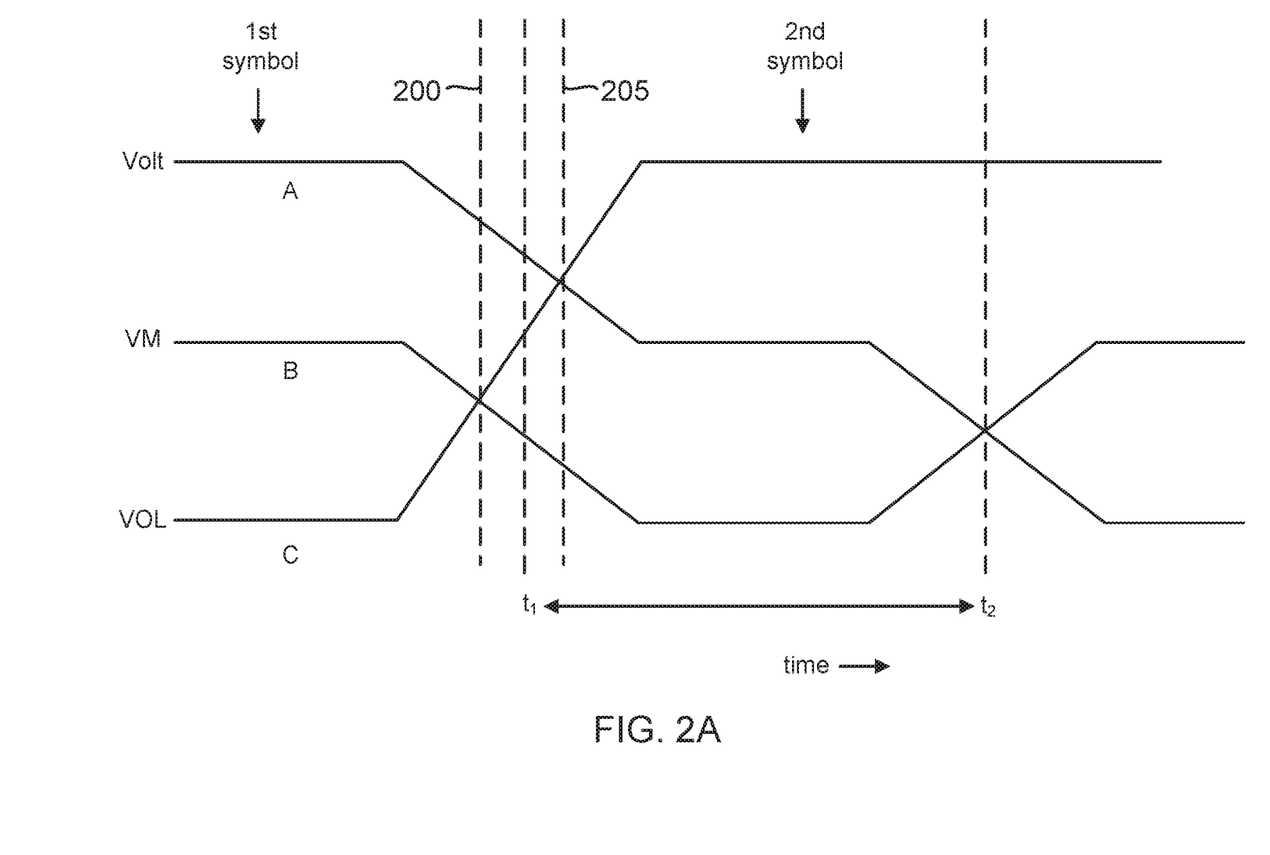
FIG. 2A illustrates a transition from one multi-phase symbol to another in which a first transmitter output signal transitions from VOH to VM and in which a second transmitter output signal transitions from VM to VOL without equalization.

If system 100 had no intelligent equalization an example transition from one symbol to another (each symbol being represented by the VOH/VM/VOL states for the three transmitters) may be as shown in FIG. 2A. The output signals of the three transmitters are designated as A, B, and C. Transmitter output signal A in the first symbol is at VOH whereas transmitter output signal B is at VM and transmitter output signal C is at VOL. In the second symbol, transmitter output signal A transitions to VM, transmitter output signal B transitions to VOL, and transmitter output signal C transitions to VOH. The boundary between the two symbols occurs at time t1. But since there is no equalization, the transmitter output signal C crosses (equals) the transmitter output signal B at a time 200 that equals t1−D, where D is a timing offset. Similarly, the transmitter output signal A equals transmitter output signal C at a time 205 that equals t1+D. The timing offsets increase data jitter. At relatively low symbol rates, such data jitter may be tolerable but becomes increasingly intolerable at higher symbol rates.

Figure 2B:
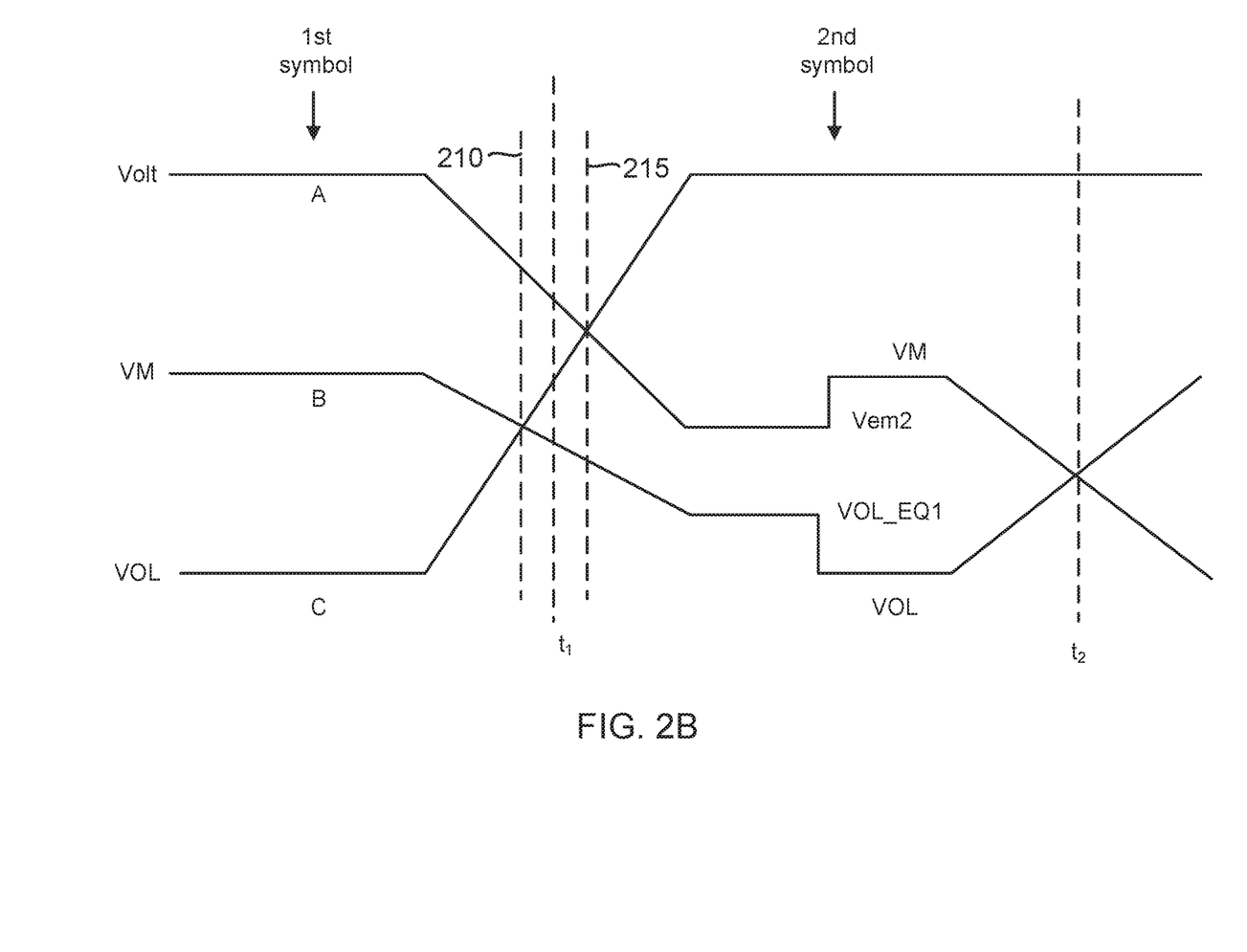
FIG. 2B illustrates the multi-phase symbol transition of FIG. 2A modified by the application of intelligent equalization such that a falling edge for the first transmitter output signal is emphasized and such that a falling edge for the second transmitter output signal is de-emphasized.

To cause times 200 and 205 to more closely approach the ideal symbol boundary time t1, both emphasis and de-emphasis may be applied as shown in FIG. 2B. The falling edge transition of transmitter output signal A that transitions from VOH to VM is emphasized such that transmitter output A is initially discharged at an enhanced rate to a reduced intermediate voltage Vem2 that is lower than mid-level voltage Vm. Around the midpoint of the second symbol, this emphasis is released so that transmitter output signal A returns to its intended value of VM. In contrast, the falling edge transition of transmitter output signal B transitioning from VM to VOL is de-emphasized such that transmitter output signal B is initially discharged at a de-emphasized rate to an increased low voltage VOL_EQ1 that is higher than VOL. Around the midpoint of the second symbol, this de-emphasis is released so that transmitter output signal B can return to its intended value of VOL. An intersection at a time 210 of transmitter output signal C with transmitter output signal B is this delayed with respect to time 200 of FIG. 2A. Conversely, an intersection at a time 215 of transmitter output signal C with transmitter output signal A is advanced in time as compared to time 205 of FIG. 2A. This is quite advantageous as the offset between times 210 and 215 from time t1 is reduced as compared to the timing offsets of times 200 and 205 from time t1.

Note that the emphasis and de-emphasis in FIG. 2A does not involve an emphasis for the transition from VOL to VOH for transmitter output C. In general, emphasizing rising or falling edges consumes additional power. The emphasized falling edge for transmitter output signal A in FIG. 2B thus does discharge more charge than if transmitter output signal A were discharged more slowly as in the non-emphasized falling edge for transmitter output signal A in FIG. 2A. But this transition is just across one half (approximately) of the voltage range between VOH and VOL. In contrast, an emphasis of the rising edge for the transmitter output signal C in its transition from VOL to VOH would consume approximately twice as much power. The emphasis of rising and falling edges as disclosed herein is thus advantageously only applied to transitions between VOH and VM and also to transitions between VM and VOL. Additional power savings are obtained through the de-emphasis of the falling edge for transmitter output signal B in FIG. 2B. As shown in FIG. 2B, the resulting intelligent equalization for transmitter outputs A and B reduces the jitter in the transition from the first symbol to the second symbol. In alternate embodiments, however, note that full rail transitions such as from VOL to VOH or from VOH to VOL may be emphasized.

Referring again to FIG. 1, a logic circuit 140 controls the intelligent equalization such as for transmitter output signals A and B as discussed with regard to FIG. 2B. Logic circuit 140 compares the intended VOH, VM, or VOL state for each transmitter output signal in a current symbol to the corresponding VOH, VM, or VOL state for each transmitter output signal in the preceding symbol to determine the applicable intelligent equalization. For example, a memory 145 may store the previous states for the transmitter output signals. If logic circuit 140 detects a transition from VOH to VM for one transmitter output signal in conjunction with a transition from VM to VOL for another transmitter output signal, it controls the corresponding transmitters to apply the emphasis and de-emphasis discussed with regard to FIG. 2B. Some example transmitter circuit implementations and corresponding control signals from logic circuit 140 will be discussed further below.

Figure 3:
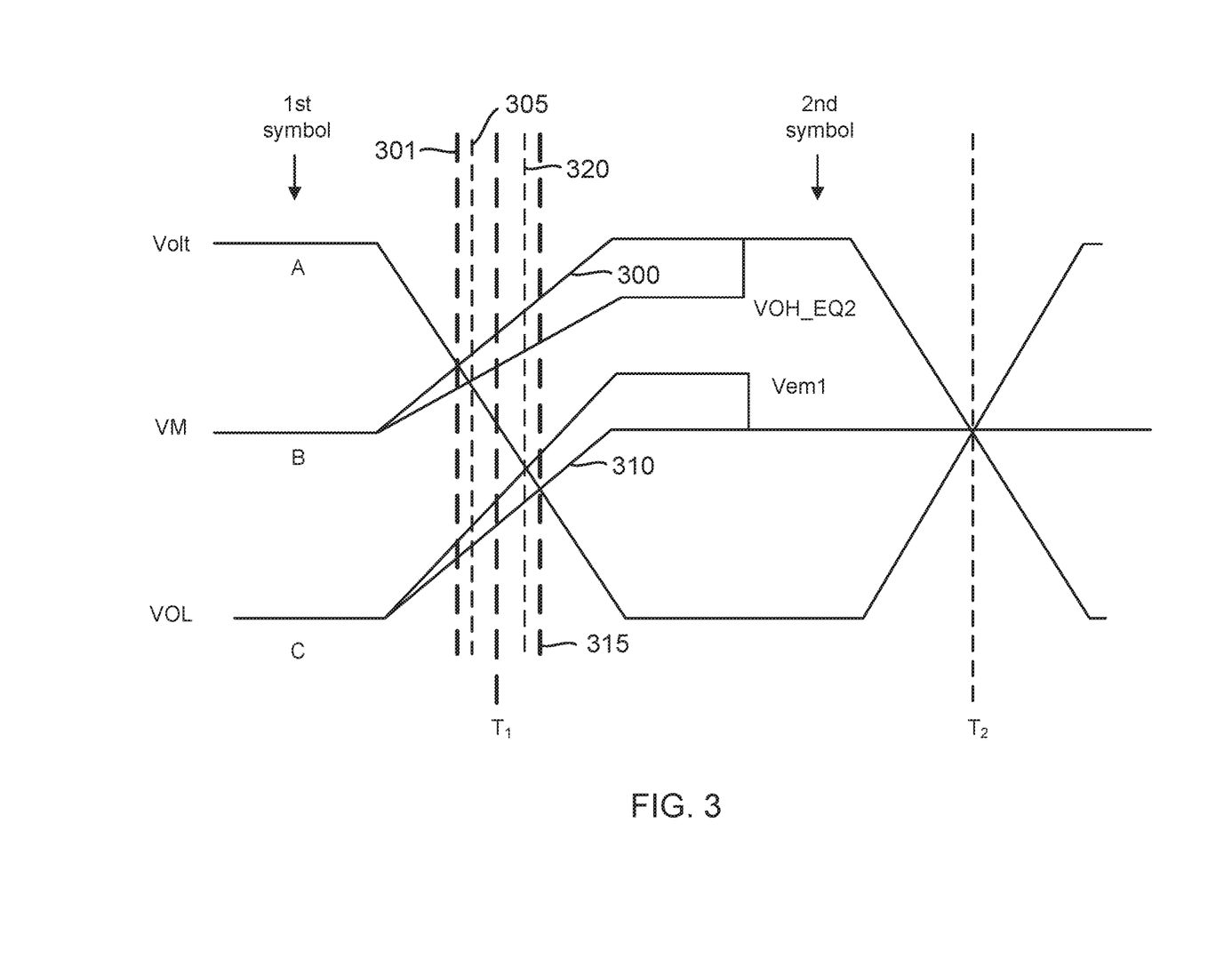
FIG. 3 illustrates a transition from one multi-phase symbol to another in which a first transmitter output signal transitions from VM to VOH and in which a second transmitter output signal transitions from VOL to VM with and without the application of intelligent equalization that de-emphasizes a rising edge for the first transmitter output signal and emphasizes a rising edge for the second transmitter output signal.

Note that FIG. 2B is thus directed to the intelligent equalization of a transition from VOH to VM for one transmitter output signal in conjunction with a transition from VM to VOL for another transmitter output signal. An analogous intelligent equalization may be applied in a transition from VOL to VM for one transmitter output signal in conjunction with a transition from VM to VOH for another transmitter output signal. An example transition between a first symbol and a second symbol is shown at a time t1 in FIG. 3. Transmitter output signal B equals VM in a first symbol and then transitions to VOH in a second symbol. To better illustrate the advantages of the intelligent equalization, a no-equalization rising edge 300 for transmitter output signal B is also shown in FIG. 3. Rising edge 300 intersects with a falling edge for transmitter output signal A at a time 301. There is a substantial timing offset between time 301 and the ideal symbol transition time of t1. To reduce this offset, the rising edge for transmitter output signal B is de-emphasized such that transmitter output signal B rises at a reduced rate to a reduced high voltage VOH_EQ2 that is less than VOH. This de-emphasis is released around the midpoint of the second symbol such that transmitter output signal B returns to its intended value of VOH for the latter portion of the second symbol. The de-emphasized rising edge for transmitter output B intersects with transmitter output signal A at a time 305 that is delayed with regard to time 301. The offset between time 305 and t1 is thus reduced as compared to the offset between time 301 and time t1.

Transmitter output signal C equals VOL in the first symbol and transitions to VM in the second symbol. A rising edge 310 without equalization for transmitter output signal C is also shown in FIG. 3 to better illustrate the advantages of the intelligent equalization. Rising edge 310 intersects with transmitter output signal A at time 315 that is delayed by the timing offset from the ideal symbol transition time of t1. To reduce this offset, the rising edge for transmitter output signal C is emphasized such that it rises at a faster rate to an enhanced midrange voltage Vem1 that is higher than VM. This emphasized rising edge for transmitter output signal C intersects with transmitter output signal A at a time 320 that is advanced compared to time 315. The offset between time 320 and time t1 is thus reduced as compared to the offset between time 315 and time t1. The resulting intelligent equalization for transmitter output signals B and C reduces the jitter in the transition from the first symbol to the second symbol. Some example control signals from logic circuit 140 to implement the intelligent equalization of FIG. 3 will be discussed further below.

Figure 4:
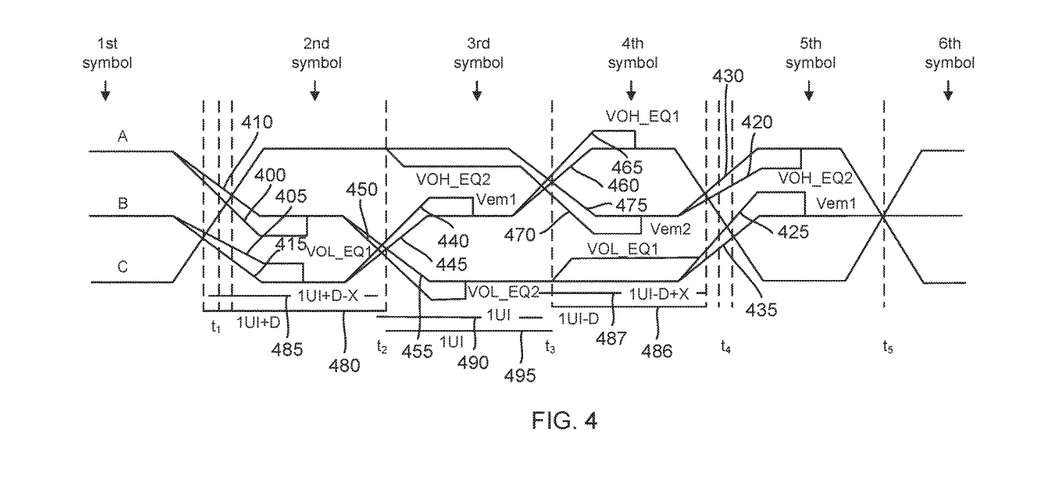
FIG. 4 illustrates the transmitter output signals for a series of multi-phase symbols with and without the application of intelligent equalization.

It is also possible that a transmitter output signal remains at VOH for two consecutive symbols. Conversely, it is possible that a transmitter output signal remains at VOL for two consecutive symbols. For example, several consecutive multi-phase symbols ranging from a first symbol through a sixth symbol are shown in FIG. 4. The first symbol and a second symbol form the transition discussed with regard to FIGS. 2A and 2B. For this transition, falling edges 400 and 405 for transmitter output signals A and B, respectively, are produced with intelligent equalization whereas corresponding falling edges 410 and 415 are produced without any equalization. A fourth symbol and a fifth symbol form the transition discussed with regard to FIG. 3. For this transition, rising edges 420 and 425 for transmitter output signals C and A, respectively, are produced with intelligent equalization whereas corresponding rising edges 430 and 435 are produced without any equalization.

In a transition from the second symbol to a third symbol, transmitter output signal C remains at VOH (without any equalization). Since at least two transmitter output signals must change state from one symbol to another so that a receiver may extract a clock signal, transmitter output signal B goes from VOL to VM in the transition from the second symbol to the third symbol whereas transmitter output signal A discharges from VM to VOL. A rising edge 440 for transmitter output signal B may thus be emphasized such that transmitter output signal B rises at an increased rate to the voltage Vem1 that is higher than VM for a first portion of the third symbol. A rising edge 445 for transmitter output signal B is also shown in FIG. 4 to illustrate a no-equalization result. Similarly, a falling edge 450 for transmitter output signal A may be emphasized such that transmitter output signal A falls at an enhanced rate to a voltage VOL_EQ1 that is lower than VOL. A falling edge 455 for transmitter output signal A illustrates a no-equalization result. Note that emphasized edges 440 and 450 concern transitions between the midlevel voltage VM and VOL. As discussed previously, emphasizing such transitions does not consume as much power as emphasizing transitions between VOL and VOH yet still significantly reduces data jitter. To provide intelligent equalization, transmitter output signal C is discharged to a voltage VOH_EQ2 that is lower than VOH for the duration of the third symbol. In this fashion, transmitter output signal C can be discharged more quickly in a subsequent symbol to either VM or VOL.

In a transition from the third symbol to a fourth symbol, transmitter output signal A remains at VOL in the absence of any equalization. However, in the same transition with intelligent equalization, transmitter output signal A is charged to the voltage VOL_EQ1 (discussed with regard to FIG. 2B) that is higher than VOL for the duration of the third symbol. In this fashion, transmitter output signal A can be charged more quickly in a subsequent symbol to either VM or VOH. Since there must be a transition for the transmitter output signals in every symbol for clock extraction at the receiver, transmitter output signal B transitions from VM to VOH at the beginning of the fourth symbol in an embodiment without equalization through rising edge 460. An emphasized rising edge 465 represents the result with intelligent equalization such that transmitter output signal B rises at an enhanced rate to the voltage VOH_EQ1 that is higher than VOH for a first portion of the fourth symbol. Similarly, a falling edge for 470 for transmitter output signal C is emphasized such that transmitter output signal C falls to Vem2 (discussed with regard to FIG. 2B) for the first portion of the fourth symbol. A falling edge 475 illustrates the transition for transmitter output signal C without equalization. Note that the emphasis for edges 465 and 470 concern transitions between VM and VOH such that their emphasis does not consume significant power yet significantly reduces data jitter.

As noted earlier, the transition from the fourth symbol to the fifth symbol is as discussed analogously with regard to FIG. 3. In a transition from the fifth symbol to a sixth symbol, transmitter output signal C transitions from VOH to VOL. Similarly, transmitter output signal B transitions from VOL to VOH. Emphasizing such full-rail edges would consume power. Thus, it is "intelligent" for no emphasis to be applied to either of these edges. However, these edges may be emphasized in alternative embodiments.

The ideal transition times between the symbols in FIG. 4 are denoted as times t1 through t5. These times are separated by the desired unit interval (UI). Without any equalization, it can be shown that a duration 480 of the second symbol equals UI+D, where D is a time offset. But after the application of intelligent equalization, a duration 485 of the second symbol becomes UI+D−X, where X is the adjustment from the intelligent equalization. Similarly, it can be shown that a duration 490 of the third symbol is UI with intelligent equalization as is a duration 495 without intelligent equalization. In contrast, a duration 486 of the fourth symbol without equalization is UI−D. But a duration 487 of the fourth symbol with intelligent equalization is increased to UI−D+X so as to more closely match the ideal symbol interval of UI.

Figure 5:
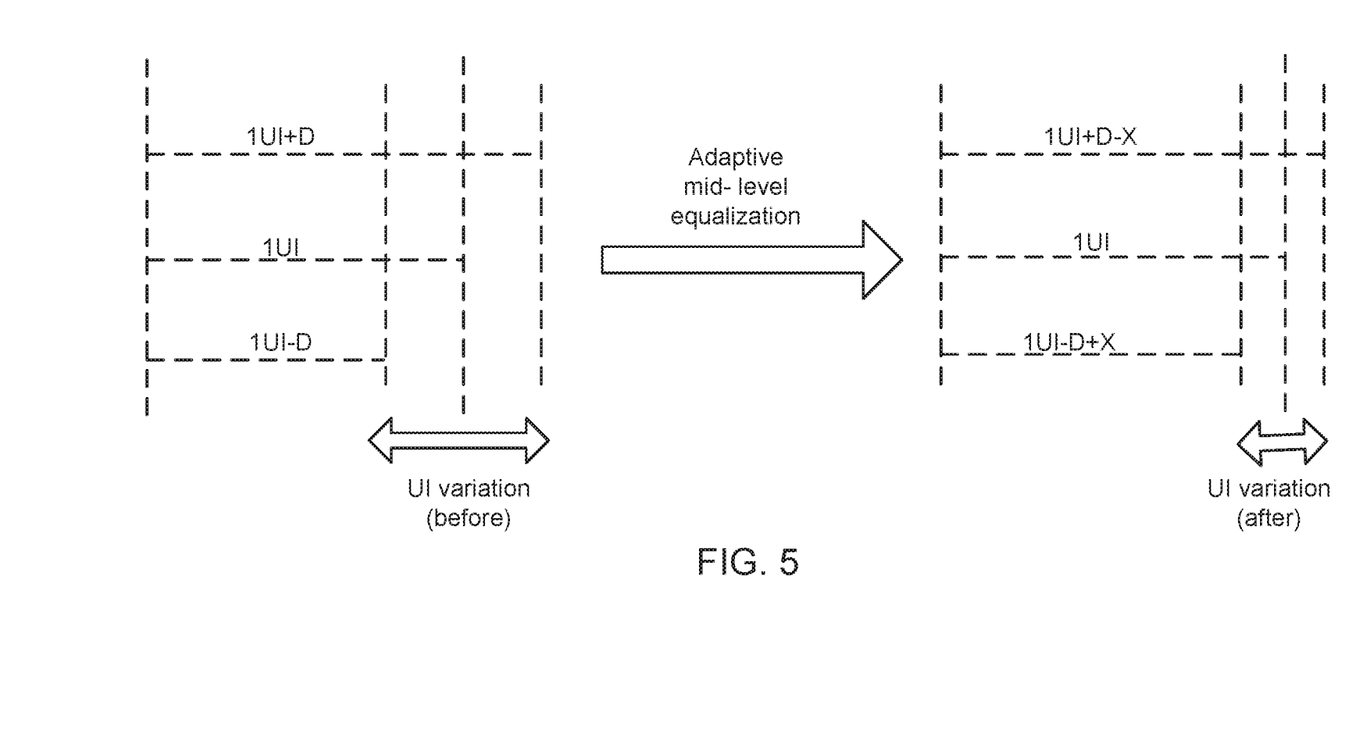
FIG. 5 illustrates the reduction of the unit interval variation from the application of intelligent equalization.

The resulting advantageous adjustment of the various symbol durations by intelligent equalization towards the desired value of UI is summarized in FIG. 5. The application of intelligent equalization may also be denoted as an application of adaptive mid-level equalization since only the rising and falling edges from or to the mid-level voltage VM are either emphasized (or de-emphasized). As shown in FIG. 5, the total UI variation without equalization is 2D whereas it is merely 2X after application of intelligent equalization. Since X is less than D, the resulting UI variation is thus significantly reduced, which reduces data jitter accordingly.

In one embodiment, logic circuit 140 and memory 145 comprise a means for means for selectively emphasizing a first falling edge for an output signal from a first one of the transmitters that is transitioning from the high voltage to the mid-level voltage and for selectively de-emphasizing a second falling edge for another output signal from a second one of the transmitters that is transitioning from the mid-level voltage to the low voltage.

Figure 6:
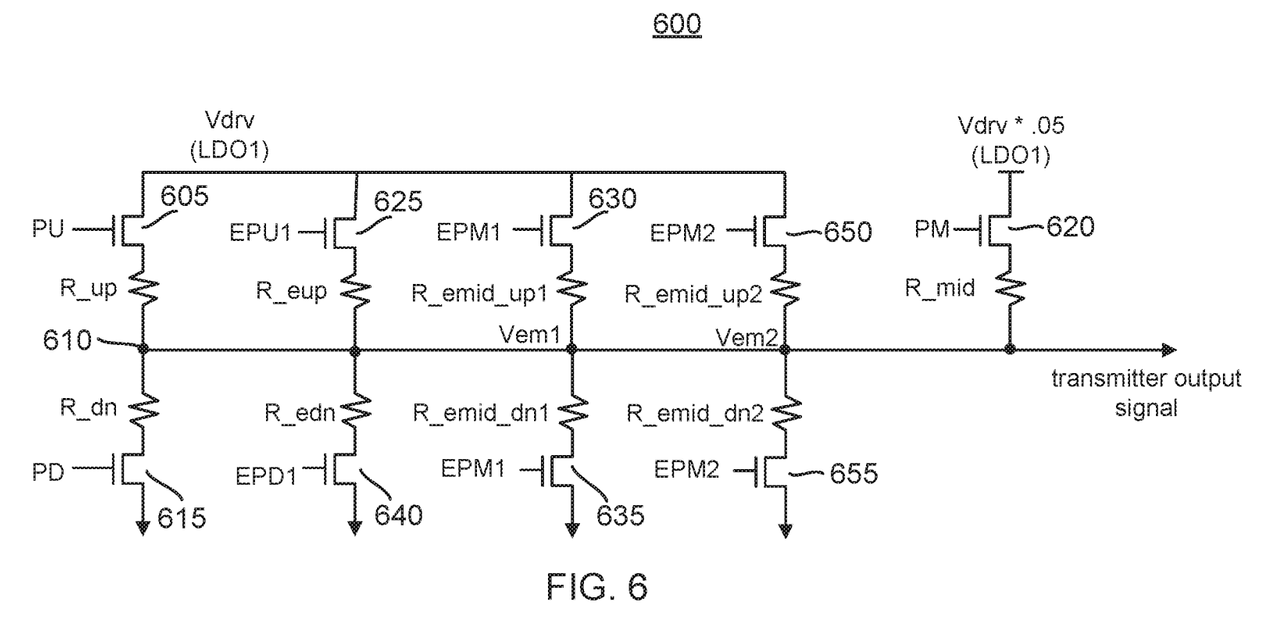
FIG. 6 is an example circuit diagram for a transmitter in the system of FIG. 1.

An example transmitter circuit diagram will now be discussed. For example, each transmitter 105, 110, and 115 discussed with regard to FIG. 1 may be implemented as shown in FIG. 6 for a transmitter 600. Referring again to FIG. 1, encoder 135 determines the VOH, VM, and VOL state for each transmitter. These states are the non-emphasized states discussed with regard to FIGS. 2B, 3, and 4 for the transmitter output signals. For example, if the pull-up signal PU1 is asserted while corresponding pull-down signal PD1 and mid-level signal PM1 for transmitter 105 are de-asserted, corresponding transmitter output signal A is charged to VOH without equalization. In that case, transmitter output signals B and C must be uniquely assigned to either VM or VOL. For example, if transmitter output signal B is to be charged to VM (without equalization), encoder 135 would assert mid-level signal PM2 while de-asserting corresponding signals PU2 and PD2. Transmitter output signal C should then be discharged to VOL (without equalization) so encoder 135 would assert pull-down signal PD3 while de-asserting signals PU3 and PM3. To communicate the no-equalization state for the current symbol (which transmitter output signal is to be VOH, which is to be VM, and which is to be VOL), encoder 135 may provide the corresponding control signals PU1, PD1, PM1, PU2, PD2, PM2, PU3, PD3, and PM3 to logic circuit 140. These same signals for the previous symbol are stored in memory 145 so that logic circuit 140 can compare the state for the previous symbol to the state for the current symbol to control the application of intelligent equalization accordingly.

The control signals from logic circuit 140 to control the application of intelligent equalization depend upon the particular circuit implementation for each transmitter 105, 110, and 115. To reduce the number of transistors within transmitters 105, 110, and 115 of FIG. 1, a plurality of voltage regulators may be used to provide a corresponding plurality of regulated voltage levels. For example, a first linear dropout regulator (LDO1, not illustrated) may provide a drive voltage Vdrv. A second LDO (LDO2, not illustrated) may provide a second drive voltage (e.g., 0.5*Vdrv).

As discussed earlier, the emphasis of rising and falling edges is released midway through a symbol as otherwise the emphasis would hinder the subsequent transition to another voltage level for the corresponding transmitter output signal. Transmitter 600 is thus configured to provide these "non-emphasized" voltage levels for the duration of a symbol (the conventional VOH, VM, and VOL levels). To do so transmitter 600 includes an NMOS pull-up transistor 605 in series with a pull-up resistor R_up. The source of pull-up transistor 605 couples to the pull-up resistor R_up whereas its drain is charged to the power supply voltage Vdrv by LDO1. The pull-up resistor R_up couples to an output node 610 for providing the transmitter output signal. A pull-up signal PU (a corresponding one of signals PU1, PU2, and PU3 discussed with regard to FIG. 1) drives the gate of pull-up transistor 605. The resistance of the pull-up resistor R_up along with an input resistance of the receiver (not illustrated) receiving the transmitter output signal forms a voltage divider that divides the power supply voltage Vdrv from LDO1 to charge output node 610 to VOH when pull-up signal PU is asserted. An analogous pull-down NMOS transistor 615 and pull-down resistor R do couple between output node 610 and ground. A pull-down signal PD (a corresponding one of signals PD1, PD2, and PD3 discussed with regard to FIG. 1) drives the gate of pull-down transistor 615 such that output node 610 is discharged to VOL upon the assertion of pull-down signal PU.

To produce the mid-level voltage VM, a serial combination of an NMOS mid-level transistor 620 and a mid-level resistor R mid couple between a power supply node for the second LDO (LDO2) and output node 610. A mid-level signal PM (a corresponding one of signals PM1, PM2, and PM3) drives the gate of mid-level transistor 620 such that output node 610 is charged to VM upon the assertion of mid-level signal PM (in the absence of intelligent equalization).

To enable emphasized rising edge 465 (FIG. 4) in which a transmitter output signal is transitioned from VM to VOH_EQ1, transmitter 600 includes an NMOS emphasized pull-up transistor 625 in series with an emphasized pull-up resistor R_eup that couples to output node 610. LDO1 drives a drain of emphasized pull-up transistor 625 with the power supply voltage Vdrv. An emphasized pull-up signal EPU1 drives the gate of transistor 625. The resistance of emphasized pull-up resistor R_eup is less than that of the pull-up resistor R_up such that when both PU and EPU1 are asserted, output node 610 is charged to VOH_EQ1. This emphasis may then be released midway through the symbol such that just pull-up transistor 605 remains on for the duration of the symbol to allow the transmitter output signal to drop to VOH.

During an emphasized falling edge in the transition from VM to VOL such as falling edge 450 of FIG. 4, pull-down signal PD is asserted in conjunction with the assertion of an emphasized pull-down signal EPD1 that drives a gate of an NMOS emphasized pull-down transistor 640 in series with an emphasized pull-down resistor R_edn that couples to output node 610. Pull-down resistor R_dn and emphasized pull-down resistor R_edn are then coupled in parallel to output node 610 to produce a resistance that is less than a resistance for pull-down resistor R_dn. Output node 610 is then discharged to VOL_EQ2. At some point in the current symbol (such as the midpoint), emphasized pull-down signal EPD1 is released (de-asserted) so that output node 610 recovers to VOL.

To emphasize the rising edge in a transition of a transmitter output signal from VOL to VM such as discussed with regard to rising edge 440 of FIG. 4, a control signal EPM1 is asserted to a voltage divider formed by a serial combination of an NMOS transistor 630, a resistor R_emid_up1, a resistor R_emid_dn1, and an NMOS transistor 635. Transistor 630 and resistor R_emid_up1 couple between the power supply node from LDO1 and output node 610. Similarly, transistor 635 and resistor R_emid_dn1 couple between the power supply node 610 and ground. Control signal EPM1 drives the gate transistors 630 and 635 to divide the power supply node Vdrv into the increased mid-level voltage Vem1. An analogous voltage divider including a pair of transistors 650 and 644, a resistor R_emid_up2, and a resistor R_emid_dn2 produce the reduced mid-level voltage Vem2 at output node 610 in response to the assertion of a control signal EMP2.

Figure 7:
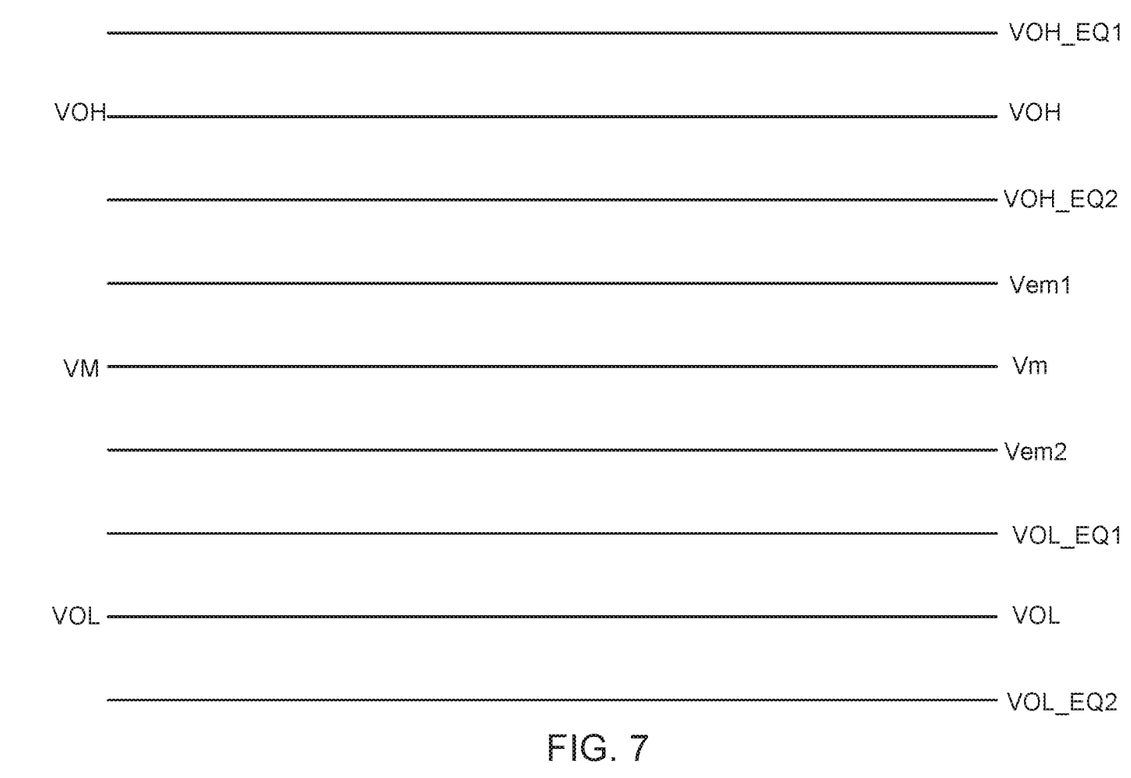
FIG. 7 illustrates example voltage levels for a transmitter output signal in the system of FIG. 1.

Regardless of the particular circuit implementation for transmitters 105, 110, and 115, example transmitter output signal voltage levels are shown in FIG. 7. Voltages VOH, VM, and VOL are the traditional (no equalization) voltage levels. Each of the voltage levels may be either emphasized or de-emphasized. VOH may thus be emphasized into VOH_EQ1. Similarly, VM may be emphasized into Vem1 whereas VOL may be emphasized into VOL_EQ2. Similarly, VOH may be de-emphasized into VOH_EQ2, VM may be de-emphasized into Vem2, and VOL de-emphasized into VOL_EQ1.

Figure 8:
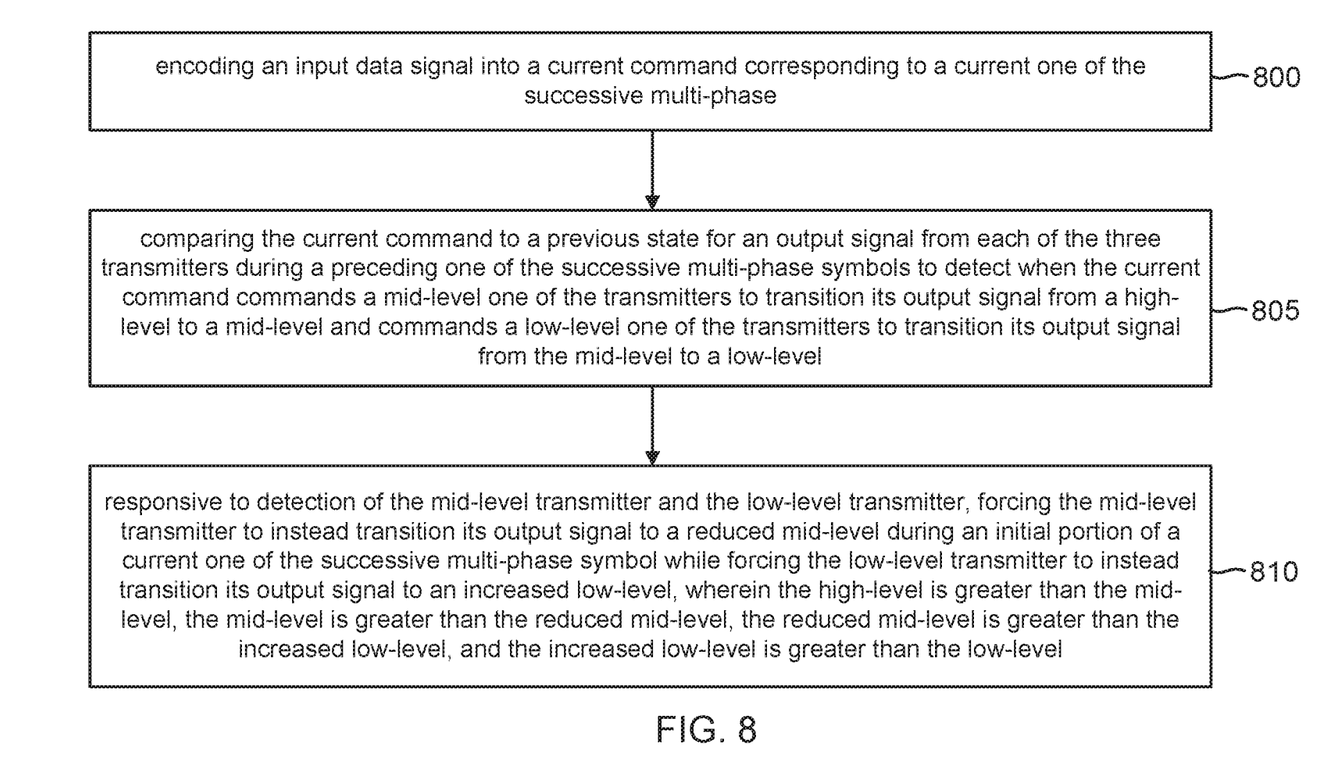
FIG. 8 is a flowchart of an example method of operation for a three-transmitter system having intelligent equalization in accordance with an aspect of the disclosure.

A method of operation for a three-transmitter system having intelligent equalization will now be discussed with regard to FIG. 8. The method includes an act 800 of encoding an input data signal into a current command corresponding to a current one of the successive multi-phase symbols. Encoder 135 encoding the input data stream into the commands (e.g., PU1, PD1, PM1, etc.) corresponding to the various multi-phase symbols is an example of act 800. The method further includes an act 805 of comparing the current command to a previous state for an output signal from each of the three transmitters during a preceding one of the successive multi-phase symbols to detect when the current command commands a mid-level one of the transmitters to transition its output signal from a high-level to a mid-level and commands a low-level one of the transmitters to transition its output signal from the mid-level to a low-level. The detection by logic circuit 140 using the previous state stored in memory 145 to detect the transitions by output signals A and B as discussed with regard to FIG. 2A is an example of act 805. Finally, the method includes an act 810 of responsive to detection of the mid-level transmitter and the low-level transmitter, forcing the mid-level transmitter to instead transition its output signal to a reduced mid-level during an initial portion of a current one of the successive multi-phase symbol while forcing the low-level transmitter to instead transition its output signal to an increased low-level, wherein the high-level is greater than the mid-level, the mid-level is greater than the reduced mid-level, the reduced mid-level is greater than the increased low-level, and the increased low-level is greater than the low-level. The commands from logic circuit 140 that force transmitter 105 to emphasize the falling edge in its output signal A as well as force transmitter 110 to de-emphasize the falling edge in its output signal B as discussed with regard to FIG. 2B during the transition from the first (multi-phase) symbol to the second multi-phase symbol is an example of act 810.

It will thus be appreciated that many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A three-transmitter system for transmitting successive multi-phase symbols, comprising:
    an encoder configured to encode data to provide commands corresponding to the successive multi-phase symbols;
    a plurality of three transmitters each configured to drive its output signal responsive to a current one of the commands to one of a plurality of signal levels for a current one of the successive multi-phase symbols; and a logic circuit configured to detect when a mid-level one of the three transmitters is commanded by the encoder to transition its output signal from a high-level to a mid-level for the current multi-phase symbol while a low-level one of the three transmitters is commanded by the encoder to transition its output signal from the mid-level to a low-level and to force the mid-level transmitter to instead transition its output signal to a reduced mid-level during an initial portion of the current multi-phase symbol and to force the low-level transmitter to instead transition its output signal to an increased low-level during the initial portion, wherein the high-level is greater than the mid-level, the mid-level is greater than the reduced mid-level, the reduced mid-level is greater than increased low-level, and the increased low-level is greater than the low-level.

2. The three-transmitter system of claim 1, wherein the output signal for each transmitter is a voltage output signal, and wherein the high-level, the mid-level, the reduced mid-level, the increased low-level, and the low-level are all voltage levels.

3. The three-transmitter system of claim 1, wherein the output signal for each transmitter is a current output signal, and wherein the high-level, the mid-level, the reduced mid-level, the increased low-level, and the low-level are all current levels.

4. The three-transmitter system of claim 2, wherein the logic circuit is further configured to detect when a high-level one of the three transmitters is commanded by the encoder to transition its output signal from the mid-level voltage to the high-level voltage for the current multi-phase symbol while a low-level-to-mid-level one of the three transmitters is commanded to transition its output signal from the low-level voltage to the mid-level voltage and to force the high-level transmitter to instead transition its output signal to a reduced high-level voltage during the initial portion of the current multi-phase symbol and to force the low-level-to-mid-level transmitter to instead transition its output signal to an increased mid-level voltage during the initial portion, wherein the high-level voltage is greater than the reduced high-level voltage, the reduced high-level voltage is greater than the increased mid-level voltage, and the increased mid-level voltage is greater than the mid-level voltage.

5. The three-transmitter system of claim 4, wherein the logic circuit is further configured to detect when a first one of the three transmitters is commanded by the encoder to transition its output signal from the mid-level voltage to the low-level voltage for the current multi-phase symbol while a second one of the three transmitters is commanded by the encoder to transition its output signal from the low-level voltage to the mid-level voltage and to force the first transmitter to instead transition its output signal to the increased mid-level voltage during the initial portion and to force the second transmitter to instead transition its output signal to a reduced low-level voltage during the initial portion, wherein the reduced low-level voltage is less than the low-level voltage.

6. The three-transmitter system of claim 4, wherein the logic circuit is further configured to detect when a sustained high-level one of the three transmitters is commanded by the encoder to maintain its output signal at the high-level voltage for the current multi-phase symbol and to force the sustained high-level transmitter to instead transition its output signal to the reduced high-level voltage during the current multi-phase symbol.

7. The three-transmitter system of claim 4, wherein the logic circuit is further configured to detect when a sustained low-level one of the three transmitters is commanded by the encoder to maintain its output signal at the low-level voltage for the current multi-phase symbol and to force the sustained low-level transmitter to instead transition its output signal to the increased low-level voltage during the current multi-phase symbol.

8. The three-transmitter system of claim 4, wherein the logic circuit is further configured to detect when a first one of the three transmitters is commanded by the encoder to transition its output signal from the high-level voltage to the mid-level voltage for the current multi-phase symbol while a second one of the three transmitters is commanded by the encoder to transition its output signal from the mid-level voltage to the high-level voltage, and to force the first transmitter to instead transition its output signal to an increased high-level voltage during the initial portion of the multi-phase symbol and to force the second transmitter to instead transition its output signal to the reduced mid-level voltage during the initial portion, wherein the increased high-level voltage is greater than the high-level voltage.

9. The three-transmitter system of claim 2, further comprising:
a memory for storing a previous state of the three transmitters during a preceding one of the multi-phase symbols, wherein the logic circuit is further configured to access the memory to assist the detection of the mid-level transmitter and of the low-level transmitter.

10. The three-transmitter system of claim 8, wherein each transmitter includes a pull-up transistor in series between a pull-up power supply node and a pull-up resistor, and wherein the pull-up resistor is connected to an output node for supplying the transmitter's output signal, and wherein the encoder is configured to drive the pull-up transistor on to transition the transmitter's output signal to the high-level voltage.

11. The three transmitter system of claim 10, wherein each transmitter further includes an enhanced pull-up transistor in series between the pull-up power supply node and an enhanced pull-up resistor, and wherein the enhanced pull-up resistor is connected to the output node, and wherein the logic circuit is further configured to drive the enhanced pull-up transistor to transition the transmitter's output signal to the increased high-level voltage.

12. The three-transmitter system of claim 10, wherein each transmitter further includes a pull-down transistor in series between the output node and a pull-down resistor, and wherein the pull-down resistor connects to ground, and wherein the encoder is further configured to drive the pull-down transistor on to transition the transmitter's output signal to the low-level voltage.

13. The three-transmitter system of claim 12, wherein each transmitter further includes an enhanced pull-down transistor in series between the output node and an enhanced pull-down resistor, and wherein the enhanced pull-down resistor connects to ground, and wherein the logic circuit is further configured to drive the enhanced pull-down transistor to transition the transmitter's output signal to the reduced low-level voltage.

14. A method of transmitting successive multi-phase symbols from three transmitters, comprising:
encoding an input data signal into a current command corresponding to a current one of the successive multi-phase symbols;
comparing the current command to a previous state for an output signal from each of the three transmitters during a preceding one of the successive multi-phase symbols to detect when the current command for the current one of the successive multi-phase symbols commands a mid-level one of the three transmitters to transition its output signal from a high-level to a mid-level and commands a low-level one of the three transmitters to transition its output signal from the mid-level to a low-level; and responsive to detection of the mid-level transmitter and the low-level transmitter, forcing the mid-level transmitter to instead transition its output signal to a reduced mid-level during an initial portion of a current one of the successive multi-phase symbol while forcing the low-level transmitter to instead transition its output signal to an increased low-level, wherein the high-level is greater than the mid-level, the mid-level is greater than the reduced mid-level, the reduced mid-level is greater than the increased low-level, and the increased low-level is greater than the low-level.

15. The method of claim 14, wherein the high-level, the mid-level, the reduced mid-level, the increased low-level, and the low-level are all voltage levels.

16. The method of claim 14, wherein the high-level, the mid-level, the reduced mid-level, the increased low-level, and the low-level are all current levels.

17. The method of claim 15, further comprising:
comparing the current command to the previous state to detect when the current command commands a high-level one of the three transmitters to transition its output signal from the mid-level voltage to the high-level voltage and commands a low-level-to-mid-level one of the three transmitters to transition its output signal from the low-level voltage to the mid-level voltage; and responsive to the detection of the high-level transmitter and the low-level-to-mid-level transmitter, forcing the high-level transmitter to instead transition to a reduced high-level voltage during the initial portion of the current multi-phase symbol while forcing the low-level-to-mid-level transmitter to instead transition to an increased mid-level voltage, wherein the high-level voltage is greater than the reduced high-level voltage, the reduced high-level voltage is greater than the increased mid-level voltage, and the increased mid-level voltage is greater than the mid-level voltage.

18. The method of claim 15, wherein the current multi-phase symbol comprises the initial portion and a remaining portion, the method further comprising:
transitioning the output signal from the mid-level transmitter to the mid-level voltage during the remaining portion; and
transitioning the output signal from the low-level transmitter to the low-level voltage during the remaining portion.

19. The method of claim 17, further comprising:
comparing the current command to the previous state to detect when the current command commands a sustained high-level one of the three transmitters to maintain its output signal at the high-level voltage; and
responsive to the detection of the sustained high-level transmitter, forcing the high-level transmitter to transition its output signal to the reduced high-level voltage during the current multi-phase symbol.

20. The method of claim 17, further comprising:
comparing the current command to the previous state to detect when the current command commands a sustained low-level one of the three transmitters to maintain its output signal at the low-level voltage; and
responsive to the detection of the sustained low-level transmitter, forcing the sustained low-level transmitter to transition its output signal to the increased low-level voltage during the current multi-phase symbol.

21. A three-transmitter system for transmitting successive multi-phase symbols, comprising:
an encoder configured to encode input data to provide successive commands corresponding to the successive multi-phase symbols;
a plurality of three transmitters each configured to drive its own output signal responsive to a current one of the commands to one of a plurality of voltage levels for a current one of the successive multi-phase symbols, the plurality of voltage levels including a high voltage, a mid-level voltage, and a low voltage; and
means for selectively emphasizing a first falling edge for an output signal from a first one of the three transmitters that is transitioning from the high voltage to the mid-level voltage while selectively de-emphasizing a second falling edge for another output signal from a second one of the three transmitters that is transitioning from the mid-level voltage to the low voltage.

22. The three-transmitter system of claim 21, wherein the means is configured to selectively emphasize the first falling edge in the output signal from the first transmitter by commanding the first transmitter to transition its output signal to a reduced mid-level voltage, and wherein the means is further configured to selectively emphasize the second falling edge in the output signal from the second transmitter by commanding the second transmitter to transition its output signal to an increased low voltage, wherein the high voltage is greater than the mid-level voltage, the mid-level voltage is greater than the reduced mid-level voltage, the reduced mid-level voltage is greater than the increased low voltage, and the increased low voltage is greater than the low voltage.

23. The three-transmitter system of claim 21, wherein the first transmitter is configured to respond to the means and the encoder by a transition of its output signal to the reduced mid-level voltage during an initial portion of a current one of the multi-phase symbols and by a transition of its output signal to the mid-level voltage during a remaining portion of the multi-phase signal.

24. The three-transmitter system of claim 23, wherein the second transmitter is configured to respond to the means and the encoder by a transition of its output signal to the increased low voltage during the initial portion and by a transition of its output signal to the low voltage during the remaining portion.

25. The three-transmitter system of claim 21, wherein the selective emphasis of the first falling edge and the selective de-emphasis of the second falling edge reduces jitter as compared to an operation of the three-transmitter system without the selective emphasis and selective de-emphasis.

\* \* \* \* \*